United States Patent [19]

Sugaki et al.

[11] Patent Number: 4,458,410
[45] Date of Patent: Jul. 10, 1984

[54] METHOD OF FORMING ELECTRODE OF SEMICONDUCTOR DEVICE

[75] Inventors: Shojiro Sugaki, Hachioji; Masahiko Ogirima, Shinjuku; Naoki Yamamoto, Kawaguchi, all of Japan

[73] Assignee: Hitachi, Ltd., Tokyo, Japan

[21] Appl. No.: 389,774

[22] Filed: Jun. 18, 1982

[30] Foreign Application Priority Data

Jul. 1, 1981 [JP] Japan .................................. 56-101214

[51] Int. Cl.³ .............................................. H01L 23/48
[52] U.S. Cl. ........................................ 29/591; 29/571; 29/578; 357/71; 357/15; 427/84; 148/1.5
[58] Field of Search ................. 29/571, 578, 591, 590; 357/71, 59, 15; 427/84; 148/1.5

[56] References Cited

U.S. PATENT DOCUMENTS

| | | | |
|---|---|---|---|
| 3,545,076 | 12/1970 | Schulten | 29/578 |
| 3,753,774 | 8/1973 | Veloric | 427/84 |
| 3,777,364 | 12/1973 | Schinella et al. | 29/578 |
| 3,889,359 | 6/1975 | Rand | 29/578 |
| 3,918,149 | 11/1975 | Roberts | 29/580 |
| 4,080,719 | 3/1978 | Wilting | 29/578 X |
| 4,106,051 | 8/1978 | Dormer et al. | 357/71 |
| 4,146,413 | 3/1979 | Yonezawa et al. | 357/71 X |
| 4,263,058 | 4/1981 | Brown et al. | 357/71 X |
| 4,276,557 | 6/1981 | Levinstein et al. | 357/71 X |

FOREIGN PATENT DOCUMENTS 55-50669  4/1980  Japan ............................. 357/715

*Primary Examiner*—Brian E. Hearn
*Assistant Examiner*—David A. Hey
*Attorney, Agent, or Firm*—Antonelli, Terry & Wands

[57] ABSTRACT

After a silicon layer is selectively grown on that part of a silicon substrate surface on which an electrode is to be formed, the silicon layer is reacted with a refractory metal so as to form the electrode made of a metal silicide layer.

22 Claims, 4 Drawing Figures

METHOD OF FORMING ELECTRODE OF SEMICONDUCTOR DEVICE

BACKGROUND OF THE INVENTION

1. Field of the Invention

The present invention relates to a method of forming the electrode of a semiconductor device, and more particularly to a method which can form a good electrode on a silicon wafer.

2. Description of the Prior Art

As is well known, the electrodes of various semiconductor devices are formed principally by employing an Al alloy as an electrode material or by producing metal silicide directly on a silicon substrate.

The method employing the Al alloy as the electrode material has the merit that the process is simple and that the manufacture is easy. Since, however, the Al alloy is readily alloyed with Si at a low temperature of about 500° C., Al penetrates into the Si substrate on account of the solid-phase diffusing reaction between Si and Al. In case a diffusion layer in the Si substrate is thin, the Al having penetrated pierces the diffusion layer easily, resulting in the disadvantages that the junction shorting takes place and that the heat resistance is conspicuously low.

The method which forms the electrode by forming metal silicide directly on the Si substrate, is more excellent in the heat resistance than the method which employs the Al alloy.

In forming the electrode, however, the metal silicide is formed by the solid phase reaction between a metal and the Si substrate, so that when it is intended to form a thick metal silicide layer, the metal silicide in a lower part thereof enters the Si substrate into the state in which the interface between the metal silicide and the corresponding part of the Si substrate lies within the original Si substrate.

Within the Si substrate, regions opposite in the conductivity type to the Si substrate are usually formed. Therefore, when the interface is formed within the Si substrate, a junction is feared to be ruined by the metal silicide, so that the thickness of the metal silicide cannot be made very great.

In order to solve this problem, there has been proposed a method in which a polycrystalline Si film heavily doped with an impurity is formed on the Si substrate in advance, and a metal film is deposited thereon to react it with the polycrystalline Si film, thereby to form the metal silicide.

Owing to the presence of the polycrystalline Si film, this method can prevent the junction within the substrate from being ruined. Since, however, a polycrystalline Si film needs to be formed in parts to become contact holes by the use of the photoetching process, the method is unsuitable for the formation of a semiconductor device of high packaging density having a very fine structure.

SUMMARY OF THE INVENTION

An object of the present invention is to solve the problems involved in the prior-art methods of forming electrodes, and to provide a method of forming the electrode of a semiconductor device which ensures a sufficient heat resistance of the electrode, which is not feared to ruin a junction within a substrate and which is also applicable to the manufacture of an integrated circuit of high packaging density.

In order to accomplish the object, according to the present invention, a Si layer is formed on that selected part of the surface of a Si substrate on which an electrode is to be formed, and a metal film is deposited onto the Si layer so as to form metal silicide.

DETAILED DESCRIPTION OF THE PREFERRED EMBODIMENT

Figure 1A:
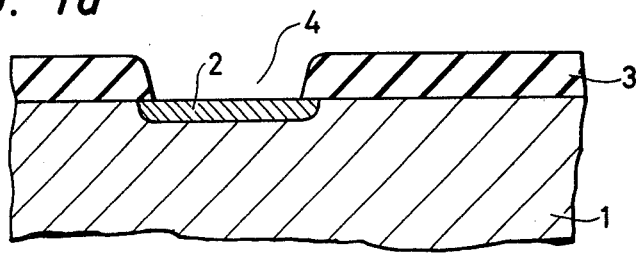
FIGS. 1a to 1d are processing flow diagrams illustrative of an embodiment of the present invention.

As shown in FIG. 1a, an impurity-doped layer 2 is formed in the surface region of a single-crystal Si substrate 1 by a well-known expedient such as thermal diffusion and ion implantation.

Using a well-known process such as thermal oxidation and chemical vapor deposition (CVD), a $SiO_2$ film 3 is deposited on the whole surface of the Si substrate. Thereafter, the part of the $SiO_2$ film overlying the impurity-doped layer 2 is selectively removed by the well-known photoetching so as to form a contact hole 4.

In an example, the deposition of the $SiO_2$ film 3 and the formation of the contact hole 4 were carried out after the impurity-doped layer 2 had been formed. Needless to say, however, the impurity-doped layer 2 may well be formed after the deposition of the $SiO_2$ film 3 and the formation of the contact hole 4 have been performed.

Figure 1B:
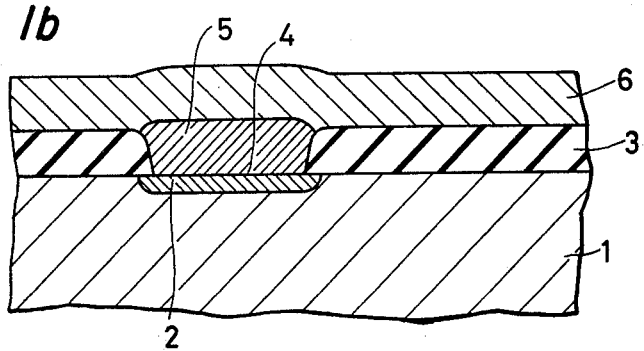

As shown in FIG. 1b, using the well-known vapor epitaxial growth which employs $SiCl_4$ and $H_2$, a Si epitaxial layer 5 is selectively grown on the exposed surface of the Si substrate 1. Thereafter, a refractory metal film 6 of Mo, Ta, Ti, W or the like is deposited on the whole surface of the resultant substrate. Two or more of such metals may well be jointly used, or an alloy consisting of such metals may well be used.

Figure 1C:
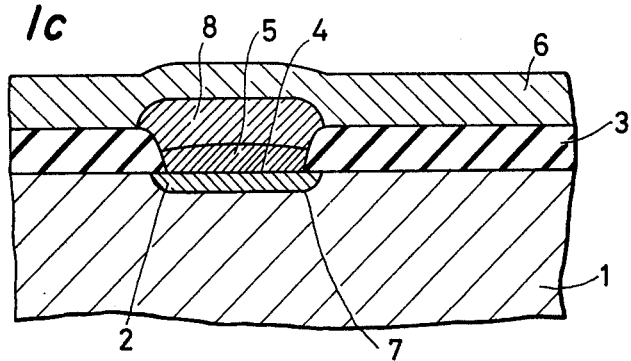

Subsequently, a heat treatment is conducted at about 500° C. or above in a non-oxidizing atmosphere. Then, a solid phase reaction takes place between the refractory metal layer 6 and the Si epitaxial layer 5, and a metal silicide layer 8 is formed as shown in FIG. 1c.

The temperature of the heat treatment for forming the metal silicide layer 8 should preferably be about 500° C.–1000° C. At a temperature below about 500° C., the metal silicide is difficult to be formed, and at a temperature above about 1000° C., the impurity-doped layer 2 spreads due to thermal diffusion and a pn-junction 7 deepens. The growth rate of the metal silicide depends greatly upon the atmosphere of the heat treatment. For example, the growth rate of the metal silicide is markedly higher with the heat treatment in a hydrogen atmosphere than with the heat treatment in a nitrogen atmosphere.

The thickness of the metal silicide layer 8 can be controlled to a desired value by changing the conditions of the heat treatment. In the example in which the heat treatment was conducted at 700° C., in the hydrogen atmosphere for 1 hour, a tungsten silicide layer 8 was about 500 nm thick.

Even when the entire Si epitaxial layer 5 reacts with the refractory metal film 6, it is only required that the produced metal silicide film 8 does not pierce the impurity-doped layer 2 to destroy the junction 7. Therefore, when the thickness of the Si epitaxial layer 5 is made great to some extent beforehand (roughly, greater than the thickness of the metal silicide layer to be formed), the formation of the metal silicide layer 8 can be performed with a sufficient allowance.

More specifically, when the Si epitaxial layer 5 is formed to be somewhat thick in advance, this layer 5 is not fully reacted in the formation of the metal silicide but is left unreacted to some degree as illustrated in FIG. 1c. Therefore, the pn-junction 7 is not feared to be spoilt by the metal silicide layer 8, and a contact having a high reliability can be formed very easily.

In the embodiment, the Si epitaxial layer 5 is formed on the impurity-doped layer 2. Since, however, the present invention requires only the formation of the metal silicide through the reaction with the refractory metal, it is possible to employ, not only the Si epitaxial layer, but also a polycrystalline silicone layer or an amorphous silicon layer. In this regard, however, it is difficult to form the amorphous silicon layer on the selected part of the impurity-doped layer 2 without using a mask or the like. In contrast, the Si epitaxial or the polycrystalline silicon layer can be selectively grown on the impurity-doped layer 2 and is therefore favorable in practical use.

After the metal silicide layer 8 has been formed, the refractory metal film 6 is etched and removed. In this case, only the unreacted refractory metal film 6 can be selectively etched and removed by employing an etchant with which the etching rate of the refractory metal is sufficiently greater than that of the metal silicide.

By way of example, in a case where Mo is employed as the refractory metal and where Mo silicide is formed, only the Mo film is selectively removed with the Mo silicide layer left behind by employing a phosphoric acid-based solution as the etchant. In a case where W is employed as the refractory metal to form W silicide, only the W film is selectively removed with the W silicide layer left behind by employing a hydrogen peroxide liquid as the etchant.

Figure 1D:
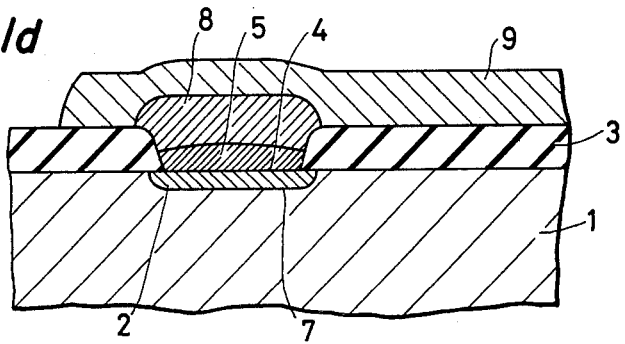

Next, a wiring metal film of, e.g., Al is deposited on the whole surface of the resultant substrate and thereafter has its unnecessary parts removed by the well-known photoetching. Then, a wiring layer 9 which is electrically connected with the metal silicide layer 8 is formed as shown in FIG. 1d.

The metal silicide layer formed in the present invention can be used as the contact electrode with the impurity-doped layer within the Si substrate, the electrode of a Schottky diode, etc. In the case of using the metal silicide layer as the electrode of the Schottky diode, it is desirable to react the entire Si epitaxial layer with the metal silicide and to hold the metal silicide layer in direct contact and the silicon semiconductor substrate.

In the above embodiment, the metal silicide layer is formed, the refractory metal layer is thereafter removed, and the wiring material layer made of Al or the like is deposited so as to form the wiring.

It is a matter of course, however, that the present invention is not restricted to such steps. By processing the unreacted refractory metal layer into a desired shape by the photoetching, it can be used as the wiring of any of various semiconductor devices, the gate electrode of a MOS field effect transistor, etc. In the cases of employing the refractory metal as the wiring of the various semiconductor devices, the gate electrode of the MOS field effect transistor, etc., a metal silicide layer can also be formed on a contact hole by a heat treatment after the refractory metal has been processed into the desired shape by the photoetching.

The metal silicide layer formed in the present invention can endure a heat treatment at temperatures up to about 1,200° C.

Accordingly, when the temperatures of various heat treatments which are conducted after the formation of the electrode are below about 1,100° C., the electrode is not feared to ruin, and almost all the ordinary silicon processes can be performed without hindrance.

Moreover, when the wiring is formed of the unreacted part of the refractory metal used for forming the metal silicide, the heat resistance is very excellent, and the specific resistance is as low as at most $2 \times 10^{-5} \Omega.\text{cm}$. Therefore, the wiring is very suitable for various semiconductor integrated circuits.

In addition, according to the present invention, Si is selectively grown on the contact hole and is reacted with the refractory metal. Therefore, the metal silicide layer is formed in a self-alignment fashion, and the method can be very easily applied to the formation of a large-scale integrated circuit having a very fine structure. The invention has such numerous merits.

What is claimed is:

1. A method of forming an electrode of a semiconductor device comprising the steps of:
   (1) depositing an insulating film onto a surface of a semiconductor substrate in a manner to expose that part of the surface on which the electrode is to be formed,
   (2) selectively growing a silicon layer on that part of the surface of said semiconductor substrate exposed after depositing of said insulating film,
   (3) depositing a refractory metal layer in a manner to cover at least said silicon layer, and
   (4) heating the resultant substrate to react silicon of said silicon layer and refractory metal of said refractory metal layer and to form a metal silicide layer, said metal silicide layer extending to a remaining portion of said silicon layer, which remaining portion remains after forming of the metal silicide layer, whereby the remaining portion of the silicon layer extends between the semiconductor substrate and the metal silicide layer.

2. A method of forming an electrode of a semiconductor device as defined in claim 1, wherein after the step (4), the following steps (5) and (6) are performed:
   (5) removing an unreacted part of said refractory metal layer, and exposing a surface of said metal silicide layer, and
   (6) forming a wiring layer connected with said metal silicide layer.

3. A method of forming an electrode of a semiconductor device as defined in claim 1, wherein after the step (4), the following step (5') is performed:
   (5') removing a desired part of an unreacted part of said refractory metal layer, and forming a wiring layer.

4. A method of forming an electrode of a semiconductor device as defined in claim 1, 2 or 3, wherein said silicon layer is selected from the group consisting of a Si epitaxial layer, a polycrystalline Si layer and an amorphous Si layer.

5. A method of forming an electrode of a semiconductor device as defined in claim 1, 2 or 3, wherein the refractory metal is at least one member selected from the group consisting of Mo, Ta, Ti and W.

6. A method of forming an electrode of a semiconductor device as defined in claim 4, wherein the refractory metal is at least one member selected from the group consisting of Mo, Ta, Ti and W.

7. A method of forming an electrode of a semiconductor device as defined in claim 1, 2 or 3, wherein said part of the surface on which the electrode is to be formed is the surface of an impurity-doped layer in said semiconductor substrate.

8. A method of forming an electrode of a semiconductor device as claimed in claim 7, wherein said impurity-doped layer forms a pn-junction with said semiconductor substrate.

9. A method of forming an electrode of a semiconductor device as defined in claim 1, 2 or 3, wherein the silicon layer selectively grown on the exposed surface of the semiconductor substrate has a thickness greater than the thickness of said metal silicide layer.

10. A method of forming an electrode of a semiconductor device as defined in claim 1, 2 or 3, wherein said heating the resulting substrate is performed at a temperature of at least 500° C. in a non-oxidizing atmosphere.

11. A method of forming an electrode of a semiconductor device as defined in claim 10, wherein said heating is performed at a temperature of 500° C.–1000° C.

12. A method of forming an electrode of a semiconductor device as defined in claim 1, 2 or 3, wherein said silicon layer is selectively grown substantially only on the surface of said semiconductor substrate exposed after said depositing an insulating film.

13. A method of forming an electrode of a semiconductor device comprising the steps of:
 (1) depositing an insulating film onto a surface of a semiconductor substrate in a manner to expose that part of the surface on which the electrode is to be formed,
 (2) selectively growing a silicon layer on that part of the surface of said semiconductor substrate exposed after depositing of said insulating film,
 (3) depositing a refractory metal layer in a manner to cover at least said silicon layer, and
 (4) heating the resultant substrate to react silicon of said silicon layer and refractory metal of said refractory metal layer and to form a metal silicide layer, said metal silicide layer extending, in the direction of the substrate surface, at most to the surface of the semiconductor substrate, whereby the metal silicide layer does not penetrate the semiconductor substrate.

14. A method of forming an electrode of a semiconductor device as defined in claim 13, wherein, in said heating step, said metal silicide layer is formed to extend substantially to the surface of the semiconductor substrate.

15. A method of forming an electrode of a semiconductor device as claimed in claims 13 or 14, wherein after the step (4), the following steps (5) and (6) are performed:
 (5) removing an unreacted part of said refractory metal layer, and exposing a surface of said metal silicide layer, and
 (6) forming a wiring layer connected with said metal silicide layer.

16. A method of forming an electrode of a semiconductor device as defined in claim 13 or 14, wherein after the step (4), the following step (5') is performed:
 (5') removing a desired part of an unreacted part of said refractory metal layer, and forming a wiring layer.

17. A method of forming an electrode of a semiconductor device as claimed in claim 13 or 14, wherein said silicon layer is selected from the group consisting of a Si epitaxial layer, a polycrystalline Si layer and an amorphous Si layer.

18. A method of forming an electrode of a semiconductor device as defined in claim 17, wherein the refractory metal is at least one member selected from the group consisting of Mo, Ta, Ti and W.

19. A method of forming an electrode of a semiconductor device as defined in claim 13 or 14, wherein the refractory metal is at least one member selected from the group consisting of Mo, Ta, Ti and W.

20. A method of forming an electrode of a semiconductor device as defined in claim 13 or 14, wherein said part of the surface on which the electrode is to be formed is the surface of an impurity-doped layer in said semiconductor substrate.

21. A method of forming an electrode of a semiconductor device as claimed in claim 20, wherein said impurity-doped layer forms a pn-junction with said semiconductor substrate.

22. A method of forming an electrode of a semiconductor device as defined in claim 13 or 14, wherein said silicon layer is selectively grown substantially only on the surface of said semiconductor substrate exposed after said depositing an insulating film.

* * * * *